US011283256B2

(12) United States Patent
Lee

(10) Patent No.: US 11,283,256 B2
(45) Date of Patent: Mar. 22, 2022

(54) POWER INTERRUPTION METHOD AND DEVICE BASED ON PHASE MEASUREMENT AND ARC DETECTION OF POWER LEVEL

(71) Applicant: Cheil Electric Wiring Devices Co., Ltd., Busan (KR)

(72) Inventor: Jun Bae Lee, Seoul (KR)

(73) Assignee: Cheil Electric Wiring Devices Co., Ltd., Busan (KR)

( * ) Notice: Subject to any disclaimer, the term of this patent is extended or adjusted under 35 U.S.C. 154(b) by 0 days.

(21) Appl. No.: 16/939,308

(22) Filed: Jul. 27, 2020

(65) Prior Publication Data

US 2021/0036504 A1 Feb. 4, 2021

(30) Foreign Application Priority Data

Jul. 29, 2019 (KR) .................. 10-2019-0091464

(51) Int. Cl.
*H02H 3/16* (2006.01)
*H02H 1/00* (2006.01)

(52) U.S. Cl.
CPC ............ *H02H 3/16* (2013.01); *H02H 1/0007* (2013.01)

(58) Field of Classification Search
CPC .. G01R 21/06; G01R 31/1272; H02H 1/0007; H02H 1/0015; H02H 1/003; H02H 1/0038; H02H 1/0061; H02H 1/063; H02H 3/08; H02H 3/16; H02H 3/20; H02H 3/32; H02H 3/325; H02H 3/33; H02H 3/36; H02H 3/382; H02H 3/387
See application file for complete search history.

(56) References Cited

U.S. PATENT DOCUMENTS

| 5,434,509 A * | 7/1995 | Blades ................. H02H 1/0015 324/536 |
|---|---|---|
| 6,532,139 B2 | 3/2003 | Kim et al. |
| 7,095,598 B2 | 8/2006 | Scott et al. |
| 7,746,605 B2 | 6/2010 | Elms et al. |
| 2010/0296220 A1* | 11/2010 | Seon ........................ H02H 3/33 361/115 |
| 2011/0188610 A1* | 8/2011 | Otsuka .................... H04L 27/06 375/317 |

(Continued)

FOREIGN PATENT DOCUMENTS

| CN | 103558460 A | | 2/2014 |
|---|---|---|---|
| CN | 109946535 A | * | 6/2019 |

(Continued)

*Primary Examiner* — Jared Fureman
*Assistant Examiner* — Nicolas Bellido
(74) *Attorney, Agent, or Firm* — The Webb Law Firm

(57) ABSTRACT

Disclosed are a power interruption method and a power interruption device based on power phase measurement and arc detection and a method thereof and disclosed are a power interruption method and a power interruption device which accurately determine, when a value measured by a current transformer (CT), a voltage detector, etc., is input into the main control unit, whether the measured value is a value equal to or more than a predetermined threshold through a comparison between phases of voltage and current to effectively prepare for a disaster such as preventing fire or protecting a subsequent circuit by a rapid and accurate power interruption by arc at a load side.

10 Claims, 14 Drawing Sheets

(56) References Cited

U.S. PATENT DOCUMENTS

2019/0081466 A1   3/2019  Ha et al.
2020/0313420 A1* 10/2020  Lee .................... H04B 3/542

FOREIGN PATENT DOCUMENTS

| GB | 2395377 A | 5/2004 |
|---|---|---|
| JP | H9237685 A | 9/1997 |
| JP | 2005117750 A | 4/2005 |
| KR | 20010069658 A | 7/2001 |
| KR | 1020120122027 A | 11/2012 |
| KR | 101277141 B1 | 6/2013 |
| KR | 1020140121593 A | 10/2014 |
| KR | 101904813 B1 | 10/2018 |
| KR | 1020190028171 A | 3/2019 |
| RU | 2571521 C2 | 12/2015 |
| WO | 2009019586 A2 | 2/2009 |

* cited by examiner

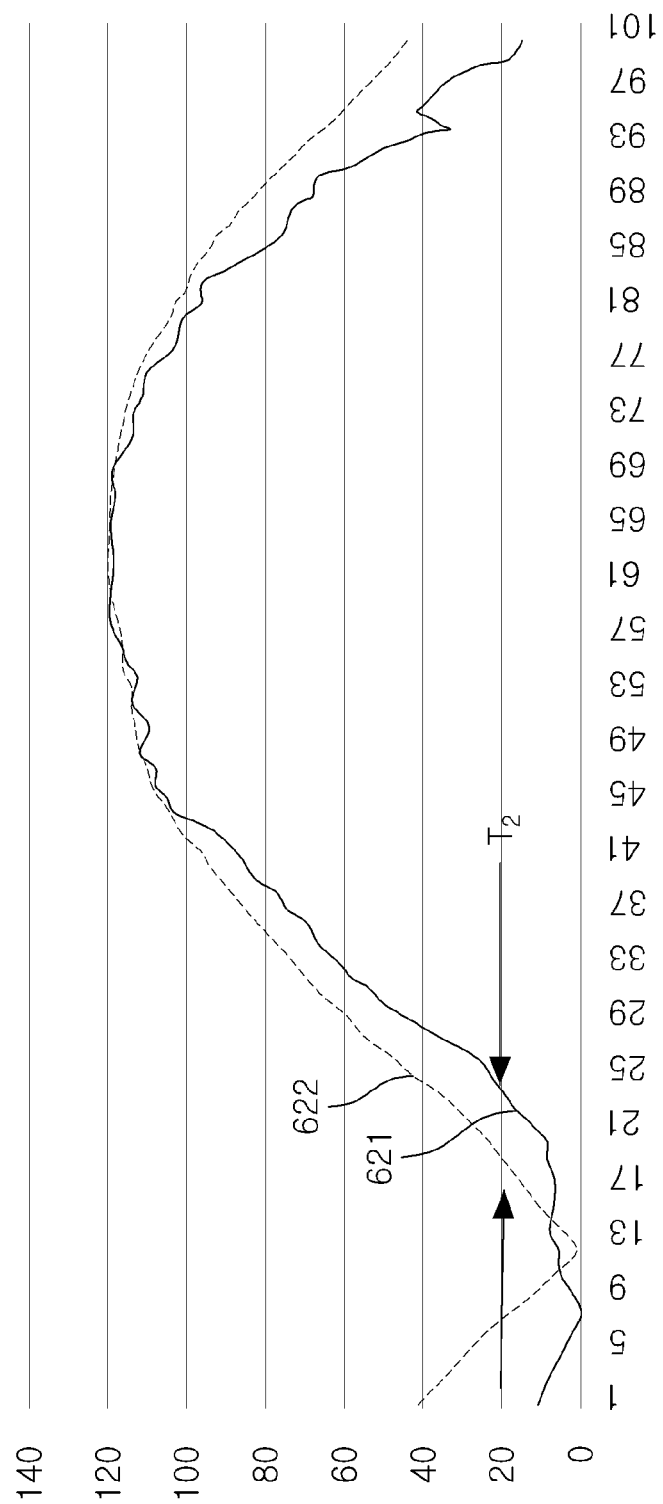

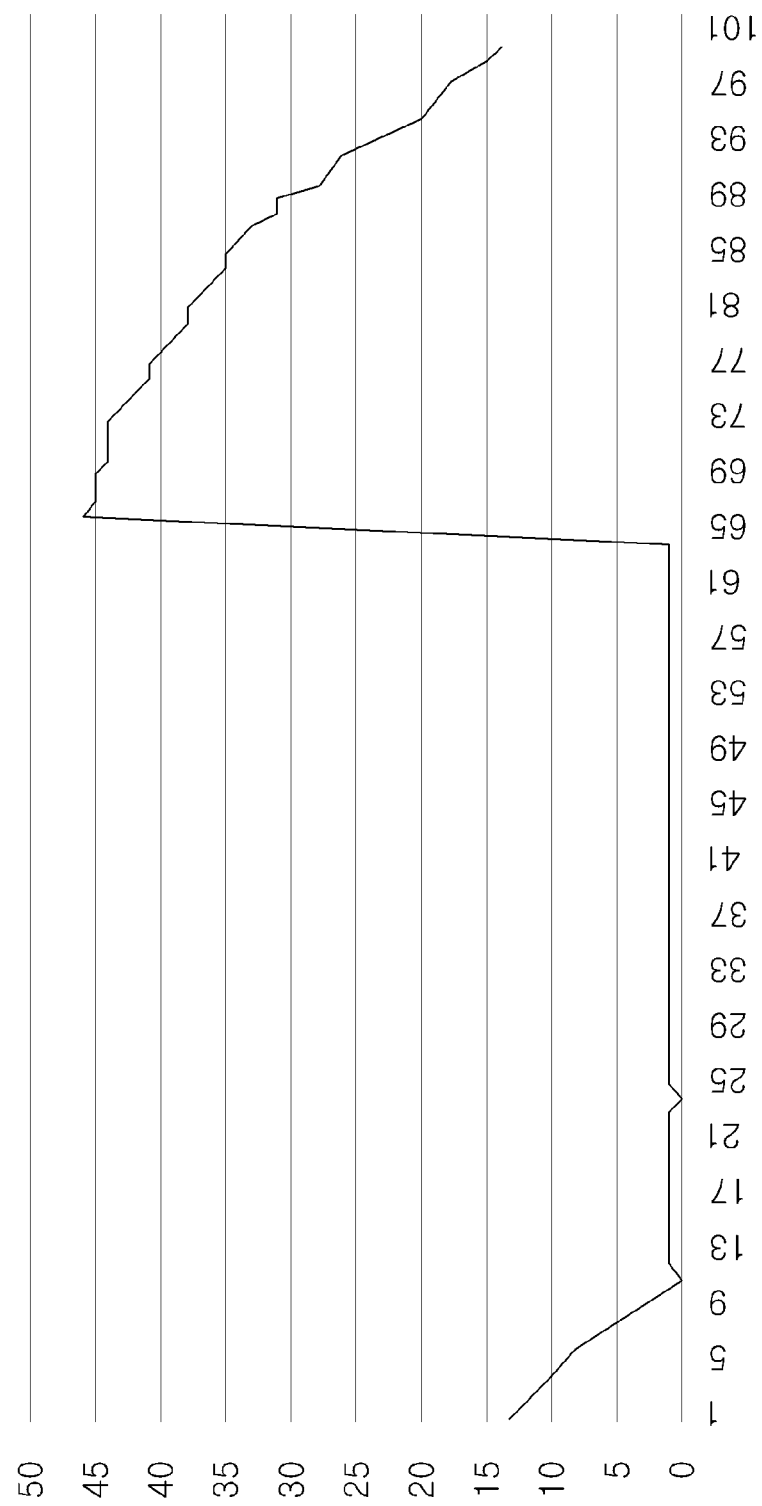

POWER INTERRUPTION METHOD AND DEVICE BASED ON PHASE MEASUREMENT AND ARC DETECTION OF POWER LEVEL

CROSS-REFERENCE TO RELATED APPLICATION

This application claims priority to Korean Patent Application No. 10-2019-0091464 filed Jul. 29, 2019, the disclosure of which is hereby incorporated by reference in its entirety.

TECHNICAL FIELD

The present invention relates to a power interruption method and a power interruption device which shut off a power supply in order to protect a load to be powered and perform power interruption in which load-side arc is detected fast and accurately by phase measurement of voltage and current.

BACKGROUND ART

In general, a power interruption device such as a short circuit breaker is installed in distribution boards such as homes, shopping malls, factories, offices, department stores, etc., and electromagnets or bimetals operate according to overcurrent generated in the case of a short circuit on a load side, a cable short circuit, etc., and are turned off so that a contact with an electric cable leading from a power supply line to an internal load is separated, thereby interrupting the supply of power to the internal load. In general, the short circuit breaker uses a zero phase current transformer (ZCT) having a ring structure. When test current is applied or load-side electric leakage current is generated, the ZCT senses the test current or the load-side electric leakage current to allow a trip device to operate to cut off a connection between an incoming terminal of the power supply line and a load terminal connected to the internal load, thereby interrupting the power supply to the internal load. Further, in general, in the distribution board, load-side instantaneous overcurrent or overvoltage is detected together with the short circuit breaker to interrupt the power supply to the load.

However, a rapid and accurate power interruption scheme for preventing fire and protecting a subsequent circuit is required because power interruption to the load is not rapidly performed when the arc is generated due to occurrence of a fault in an electrical wire or a short-circuit between the electrical wires or between the electrical wire and the ground.

As a related prior document, Korean Patent Application No. 10-2012-0122027 (Dec. 31, 2012) may be referred to.

SUMMARY OF THE INVENTION

Accordingly, the present invention has been made in an effort to provide a power interruption method and a power interruption device which accurately determine, when a value measured by a current transformer (CT), a voltage detector, etc., is input into the main control unit, whether the measured value is a value equal to or more than a predetermined threshold through a comparison in phase between voltage and current to effectively prepare for a disaster such as preventing fire or protecting of a subsequent circuit by rapid and accurate power interruption by arc at a load side.

First, when a feature of the present invention is summarized, an exemplary embodiment of the present invention provides a power interruption method by a power interruption device, which includes: receiving a first detection signal and a second detection signal detected by using a current transformer and a voltage detector coupled to a power supply line supplying power to a load, respectively; generating a control signal by sensing generation of arc in the load for a first target signal and a second target signal input based on the first detection signal and the second detection signal, respectively; and interrupting the power supply to the load according to the control signal, in which in the generating of the control signal, ADC values of the first and second target signals, respectively, are generated to generate the control signal based on a phase difference of each of the first and second target signals at a predetermined signal magnitude level.

The power interruption method may further include, in which the power is AC power, generating the first and second target signals by rectifying the first detection signal and the second detection signal, respectively, before the generating of the control signal.

The phase difference is determined within a semi-period of the AC power.

The first and second target signals are subjected to low pass filtering and predetermined signal adjustment for removing high-frequency noise after the respective target signals are rectified.

In the power interruption method, in the generating of the control signal, in the generating of the control signal, the power supply to the load may be effectively interrupted for the arc generation at the load side by comparing the phase difference and a threshold for interrupting the power supply to the load by arc trip.

For application to a complex load, the predetermined signal magnitude level may include a plurality of level corresponding to the respective loads and the control signal may be generated based on the phase difference at each level.

For each level, respective thresholds for interrupting the power supply to the load by arc trip may be set to the same value or for each level and respective thresholds for interrupting the power supply to the load by the arc trip may be set to different values.

The power interruption method may further include storing, in a memory, data of the ADC value of each of the first and second target signals during a predetermined period before the arc is generated.

The power interruption method may further include displaying a text or graph for the data of the ADC value of each of the first and second target signals on a display device in real time.

Another exemplary embodiment of the present invention provides a power interruption device which includes: a current transformer and a voltage detector coupled to a power supply line supplying power to a load; the main control unit generating a control signal by sensing generation of arc in the load for a first target signal and a second target signal input based on a first detection signal and a second detection signal detected by using the current transformer and the voltage detector, respectively; and a circuit breaker interrupting the power supply to the load according to the control signal, in which the main control unit generates ADC values of the first and second target signals, respectively to generate the control signal based on a phase difference of each of the first and second target signals at a predetermined signal magnitude level.

According to a power interruption method and a power interruption device according to exemplary embodiments of the present invention, when a value measured in a current transformer (CT), a voltage detector, etc., is input into the main control unit, it is accurately determined whether a target signal is a value equal to or more than a threshold by a scheme of measuring and comparing a difference in phase of voltage/current at a predetermined level for the target signal during a digital analysis processing process to effectively prepare for a disaster such as preventing fire or protecting a subsequent circuit by rapid and accurate power interruption by arc at a load side.

BRIEF DESCRIPTION OF THE DRAWINGS

In order to help understand the present invention, the accompanying drawings which are included as a part of the Detailed Description provide embodiments of the present invention and describe the technical spirit of the present invention together with the Detailed Description.

FIGS. 6A and 6B illustrate an example of a waveform diagram showing a phase difference of a target signal during two periods when arc is generated.

FIGS. 8A to 8D are diagrams for describing a determination for a change in phase difference when arc is generated in a complex load of a resistor and a dimmer in the present invention.

DETAILED DESCRIPTION

Figure 1:
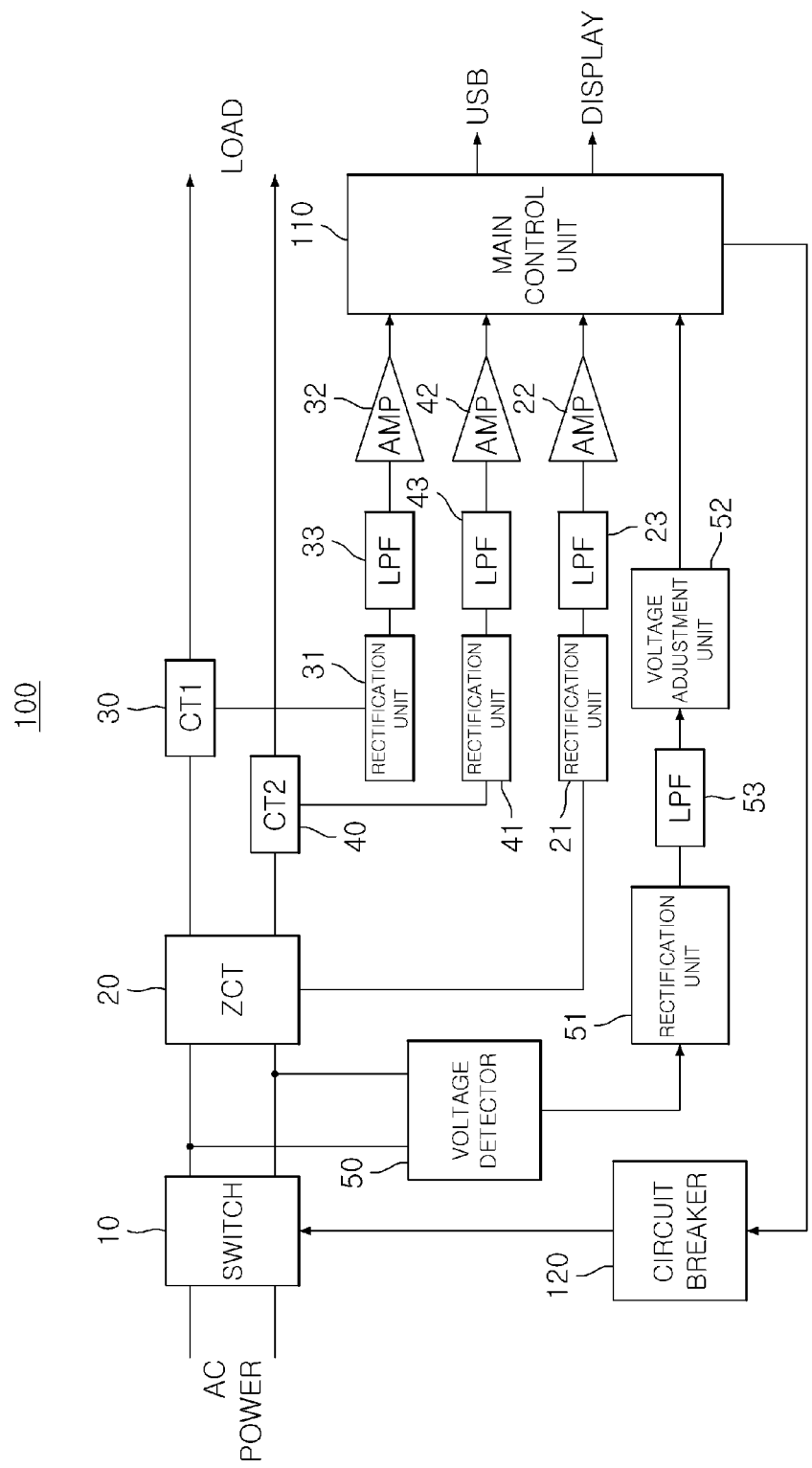
FIG. 1 is a diagram for describing a power interruption device according to an exemplary embodiment of the present invention.

Hereinafter, the present invention will be described in detail with reference to the accompanying drawings. In this case, the same components in each drawing are represented by the same reference numerals as much as possible. In addition, detailed descriptions of already known functions and/or configurations are omitted. The following description focuses on parts necessary for understanding the operation according to various embodiments, and descriptions of elements that may obscure the gist of the description are omitted. In addition, some components of the drawings may be exaggerated, omitted, or schematically illustrated. The size of each component does not entirely reflect the actual size, and thus the contents described herein are not limited by the relative size or spacing of the components drawn in the respective drawings.

In describing the exemplary embodiments of the present invention, a detailed description of the known art related to the present invention will be omitted when it is judged that the detailed description may unnecessarily make the gist of the present invention unclear. In addition, terms to be described below as terms which are defined in consideration of functions in the present invention may vary depending on the intention of a user or an operator or usual practice. Accordingly, the terms need to be defined based on contents throughout this specification. Terms used in a detailed description are to just describe the exemplary embodiments of the present invention and should not be restrictive in any way. Unless specifically used otherwise, expression of a singular form includes a meaning of a plural form. In the present description, an expression such as "including" or "comprising" is intended to indicate certain features, numbers, steps, operations, elements, some or combinations thereof and should not be construed to preclude the presence or possibility of one or more other features, numbers, steps, operations, elements, some or combinations thereof in addition to the described things.

Terms including as first, second, and the like are used for describing various constituent elements, but the constituent elements are not limited by the terms and the terms are used only for distinguishing one constituent element from other constituent elements.

FIG. 1 is a diagram for describing a power interrupting device 100 according to an exemplary embodiment of the present invention.

Referring to FIG. 1, the power interrupting device 100 according to an exemplary embodiment of the present invention includes a zero phase current transformer (ZCT) 20, current transformers 30 and 40, and a voltage detector 50 coupled to a power supply line supplying power to a load and includes rectification units 21, 31, 41, and 51 for signal transformation or adjustment, amplifiers 22, 32, and 42, and a voltage adjustment unit 52. Between the rectification units 21, 31, 41, and 51 and the amplifiers 22, and 32, and 42 or the voltage adjustment unit 52, low pass filters (LPF) 23, 33, and 43, and 53 for removing high frequency noise through low pass filtering may be provided, respectively. Further, the power interrupting device 100 includes a main control unit 110, a circuit breaker 120, and a switch 10 for controlling whether to interrupt power supplied to a load by analyzing signals from the components.

The power interruption device 100 is installed in distribution boards such as homes, shopping malls, factories, offices, department stores, etc., and according to overcurrent generated in the case of electric leakage, cable short-circuit, arc, etc., at the load side, the main control unit 110 generates a control signal and the circuit breaker 120 generates a drive signal for interrupting a power supply to the load according to the control signal, and the switch 10 accordingly drives a trip device (e.g., operating of a crossbar, a latch, etc.) to cut off a connection between an incoming terminal into which AC power comes and a load terminal connected to the load (turn off a contact between terminals to be separated), thereby interrupting the power supply to the load.

The main control unit 110 takes charge of an overall control of the components of the power interrupting device 100 and generates a control signal for an instantaneous trip (driving of the trip device for instantaneous overcurrent), a electric leakage trip (driving of the trip device for overcurrent in electric leakage, or an arc trip (driving of the trip device for overcurrent by arc) for the power supply to the load for an input target signal based on a detection signal detected by the ZCT 20, the current transformers 30 and 40, or the voltage detector 50. The main control unit 110 may be constituted by hardware (e.g., a micro control unit (MCU), a central control unit (CPU), etc.) such as a semiconductor processor, etc., for the overall control of the components and may also be implemented to operate in combination with software such as an application program, etc.

The ZCT 20 has a ring structure for penetration of two power supply lines (e.g., a HOT line and a NETRAL line) (generally including penetration of a test line for a test) and the ZCT 20 senses current which flows on two power supply lines (e.g., the HOT line and the NETRAL line) penetrating the ring structure between the switch 10 and the load to generate an electrical signal corresponding to the sensed current, such as overcurrent generation, etc., as the detection signal. For example, with generation of instantaneous overcurrent or overcurrent by electric leakage or short-circuit at the load side, when a current sum value of power supply lines penetrating the ring structure of the ZCT 20 does not become zero, the ZCT 20 generates the electrical signal corresponding thereto and the corresponding signal of the ZCT 20 as a target signal for a power instantaneous trip, an electric leakage trip, or the arc trip is input into the main control unit 110 via the rectification unit 21 for full wave rectification, such as a bridge diode, etc., and the amplifier 22 for amplifying a signal at a predetermined level.

In the present invention, it is exemplified and described that incoming AC power is the hot line and the neutral line, but the present invention is not limited thereto and in some cases, when power such as 3-phase 3-wire/4-wire is supplied to the load, the incoming AC power may be similarly applied even to 3 power lines, 4 power lines (e.g., 3-phase R, S, and T and neutral line N), etc.

The current transformers 30 and 40 generate an electrical signal corresponding to a magnitude of current for each power supply line as the corresponding detection signal. The corresponding detection signals generated by each of the current transformers 30 and 40 may be input into the main control unit 110 via the rectification unit 31/41 such as the bridge diode, etc., and the amplifier 32/42 for amplifying the signal to a predetermined level as the target signal for the instantaneous trip, the electric leakage trip, or the arc trip.

Figure 3:
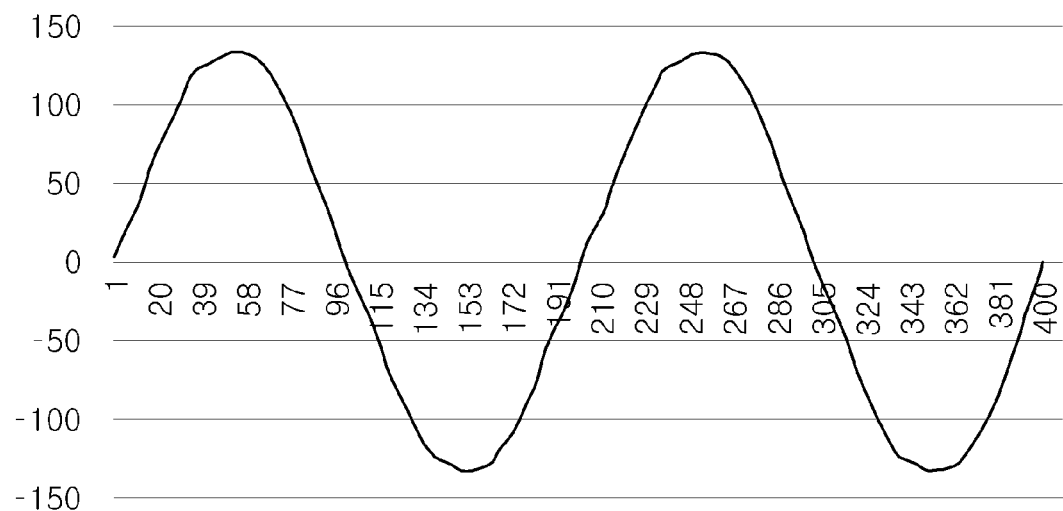
FIG. 3 is a diagram for describing AC power exemplified in the present invention.
Figure 4:
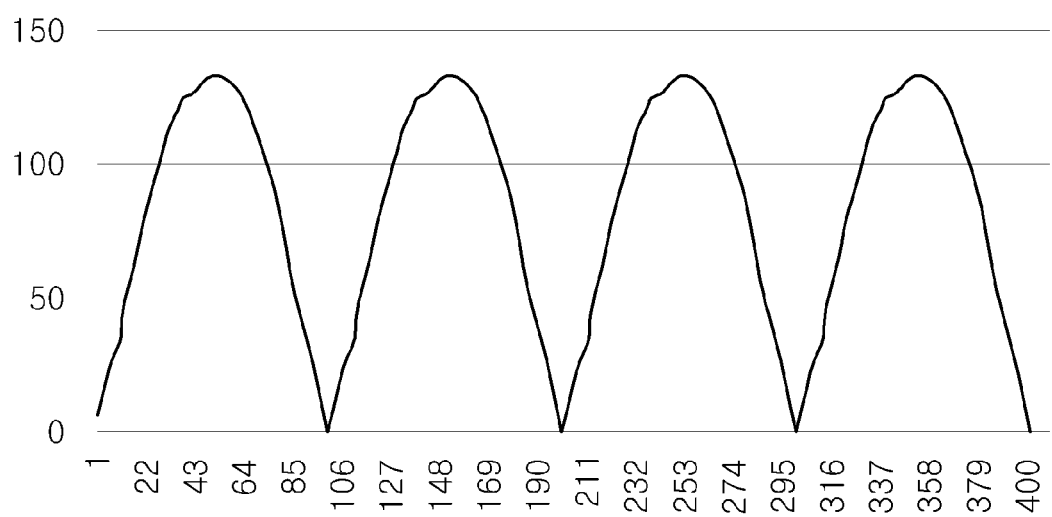
FIG. 4 is a diagram for describing a rectified signal output from a rectification unit exemplified in the present invention.

The voltage detector 50 generates an electrical signal corresponding to a magnitude (e.g., 220 V) of voltage in two power supply lines as the corresponding detection signal as illustrated in FIG. 3. The corresponding electrical signal of the voltage detector 50 may be rectified by the rectification unit 51 such as the bridge diode, etc., as illustrated in FIG. 4 and the voltage adjustment unit 52 may adjust the signal at a predetermined level for inputting the signal into the main control unit 110 and input the adjusted signal into the main control unit 110 as the target signal for the instantaneous trip, the electric leakage trip, or the arc trip.

In particular, in the present invention, the main control unit 110 analyzes the corresponding target signals (a first target signal based on one of the current transformers 30 and 40 and a second target signal based on the voltage detector 50) input after being processed by the rectification units 31, 41, and 51 and the amplifiers 22, 32, and 42/the voltage adjustment unit 52 based on the detection signals detected by one of the current transformers 30 and 40 and the voltage detector 50 and senses arc generation at the load to generate a control signal for an arc trip for the power supply to the load. In other words, the main control unit 110 generates an analog to digital converter (ADC) value of the corresponding target signal, and as a result, whether to satisfy a threshold condition for arc trip for a target signal during a digital analysis processing process is rapidly determined in a semi-period to effectively interrupt a=power supply to the load for instantaneous overcurrent or overcurrent by electric leakage or short-circuit at the load side. For example, according to the overcurrent generated in the case of the arc at the load side, the main control unit 110 generates a control signal and the circuit breaker 120 generates a drive signal for interrupting a power supply to the load according to the control signal, and the switch 10 accordingly drives a trip device (e.g., operating of a crossbar, a latch, etc.) to cut off a connection between an incoming terminal into which AC power comes and a load terminal connected to the load (turn off a contact between terminals to be separated), thereby interrupting the power supply to the load. Besides, the main control unit 110 generates the control signal to further control the instantaneous trip or electric leakage trip.

The main control unit 110 may store data of the ADC value of the target signal during a predetermined period (e.g., one hour, two hours, etc.) before the instantaneous strip, the electric leakage trip, or the arc trip in a memory. For example, the data of the ADC value of the target signal during a predetermined period is stored in a volatile memory connected to a USB port, and as a result, a cause analysis of the interruption occurrence and a follow-up measure may be applied to be rapidly taken.

The main control unit 110 may output data so as to display the power interruption depending on occurrence of the instantaneous trip, the electric leakage trip, or the arc trip on a display device (e.g., LCD, LED, etc.) in real time in a text or graph form for the data of the ADC value of the corresponding target signal. According to the display, in order to determine the corresponding data when the power is interrupted, it may be easily verified whether the overcurrent is generated due to serial arc or parallel arc, or overload immediately through the display device (e.g., LCD, LED, etc.) even though an external interface is not connected.

In particular, in the present invention, the overcurrent by the load-side arc, etc., is rapidly tripped within the semi-period of the AC power to effectively prepare for disasters such as damage to a subsequent circuit, fire, etc., due to the overcurrent.

For example, the main control unit 110 generates the ADC values of the target signals for the corresponding current/voltage detection to generate the control signal for the power interruption by using that a phase difference between the ADC values of the corresponding target signals (a first target signal based on one of the current transformers 30 and 40 and a second target signal based on the voltage detector 50) at a predetermined signal magnitude level is changed when the arc is generated. In other words, when the target signal measured by using the current transformer 30/40, the voltage detector 50, etc., is input into the main control unit 110, whether to satisfy a threshold condition for the arc trip for a target signal during a digital analysis processing process is rapidly determined within the semi-period to effectively interrupt a power supply to the load for overcurrent by the arc at the load side.

Hereinafter, an operation of the power interrupting device 100 according to an exemplary embodiment of the present invention will be described in more detail with reference to a flowchart of FIG. 2.

Figure 2:
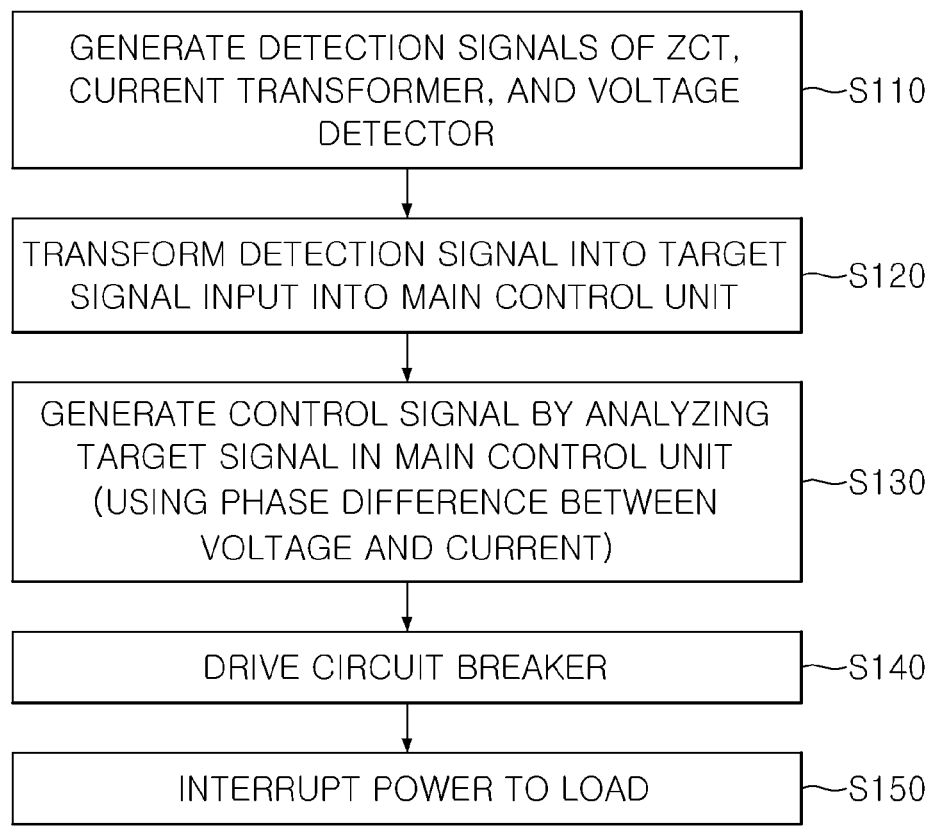
FIG. 2 is a flowchart for describing an operation of a power interruption device according to an exemplary embodiment of the present invention.

FIG. 2 is a flowchart for describing an operation of a power interrupting device 100 according to an exemplary embodiment of the present invention.

First, the ZCT 20, the current transformers 30 and 40, and the voltage detector 50 generate each detection signal (S110). The ZCT 20 senses current which flows on two power supply lines (e.g., a hot line and a neutral line) penetrating the ring structure between the switch 10 and the load and generates an electrical signal corresponding to the sensed current, such as overcurrent generation as the detection signal. The current transformers 30 and 40 generate an electrical signal corresponding to a magnitude of current for each power supply line as the corresponding detection signal. The voltage detector 50 generates an electrical signal corresponding to a magnitude (e.g., 220 V) of voltage in two power supply lines as the corresponding detection signal as illustrated in FIG. 3.

Rectification or amplification of the detection signal generated in each of the ZCT 20, the current transformers 30 and 40, and the voltage detector 50 is adjusted and the detection signal as the target signal is input into the main control unit 110 (S120). The corresponding detection signal generated by the ZCT 20 is input into the main control unit 110 via a rectification unit 21 such as a bridge diode, etc., and an amplifier 22 for amplifying the signal to a predetermined level as the target signal for the instantaneous trip, the electric leakage trip, or the arc trip. The corresponding detection signals generated by each of the current transformers 30 and 40 may be input into the main control unit 110 via the rectification unit 31/41 such as the bridge diode, etc., and the amplifier 32/42 for amplifying the signal at a predetermined level as the target signal for the arc trip. The corresponding detection signal generated by the voltage detector 50 may be rectified by the rectification unit 51 such as the bridge diode, etc., as illustrated in FIG. 4 and the voltage adjustment unit 52 may adjust the signal at a predetermined level for inputting the signal into the main control unit 110 and input the adjusted signal into the main control unit 110 as the arc trip.

The main control unit 110 analyzes the corresponding target signals input after being processed by the rectification units 31 and 41, the amplifiers 32 and 42, and the voltage adjustment unit 52, in particular, based on the detection signal detected by one preselected current transformer of the current transformer 30/40 and the voltage detector 50 and generates the control signal for the arc trip for the power supply to the load (S130).

The main control unit 110 generates analog to digital converter (ADC) values of the corresponding target signals and accordingly rapidly determines within the semi-period whether the phase difference of the ADC values of the target signals (the first target signal based on any one of the current transformers 30 and 40 and the second target signal based on the voltage detector 50) at a predetermined signal magnitude level satisfies a predetermined threshold condition during the digital analysis processing process to effectively interrupt the power supply to the load for the overcurrent by the arc at the load side. In other words, in the present invention, the overcurrent by the load-side arc, etc., is rapidly tripped within the semi-period of the AC power input to effectively prepare for a disaster such as damage to a subsequent circuit, fire, etc., due to the overcurrent.

For example, the main control unit 110 generates the ADC values of the target signals for the corresponding current/voltage detection to generate the control signal for the power interruption by using that a phase difference between the ADC values of the corresponding target signals at a predetermined signal magnitude level is changed when the arc is generated.

Figure 5A:
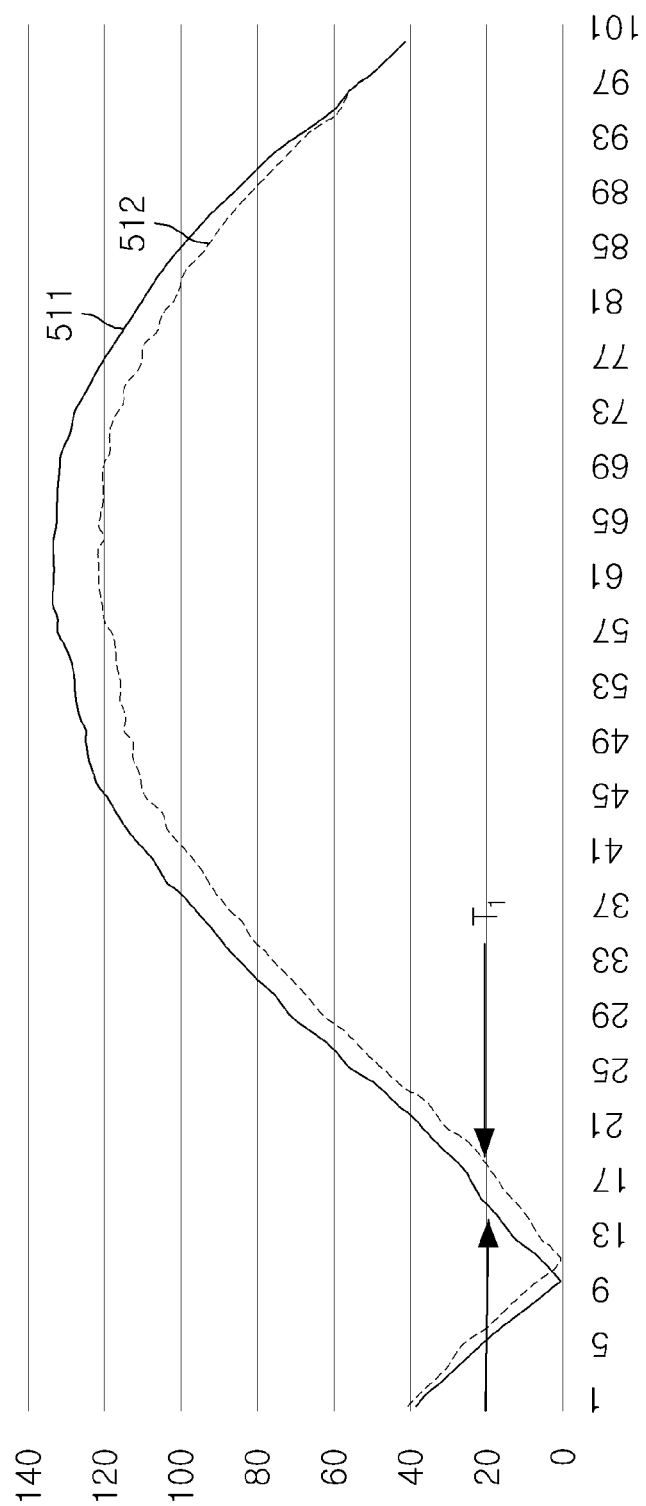
FIGS. 5A and 5B illustrate an example of a waveform diagram showing a phase difference of a target signal during two periods of a normal state.
Figure 5B:
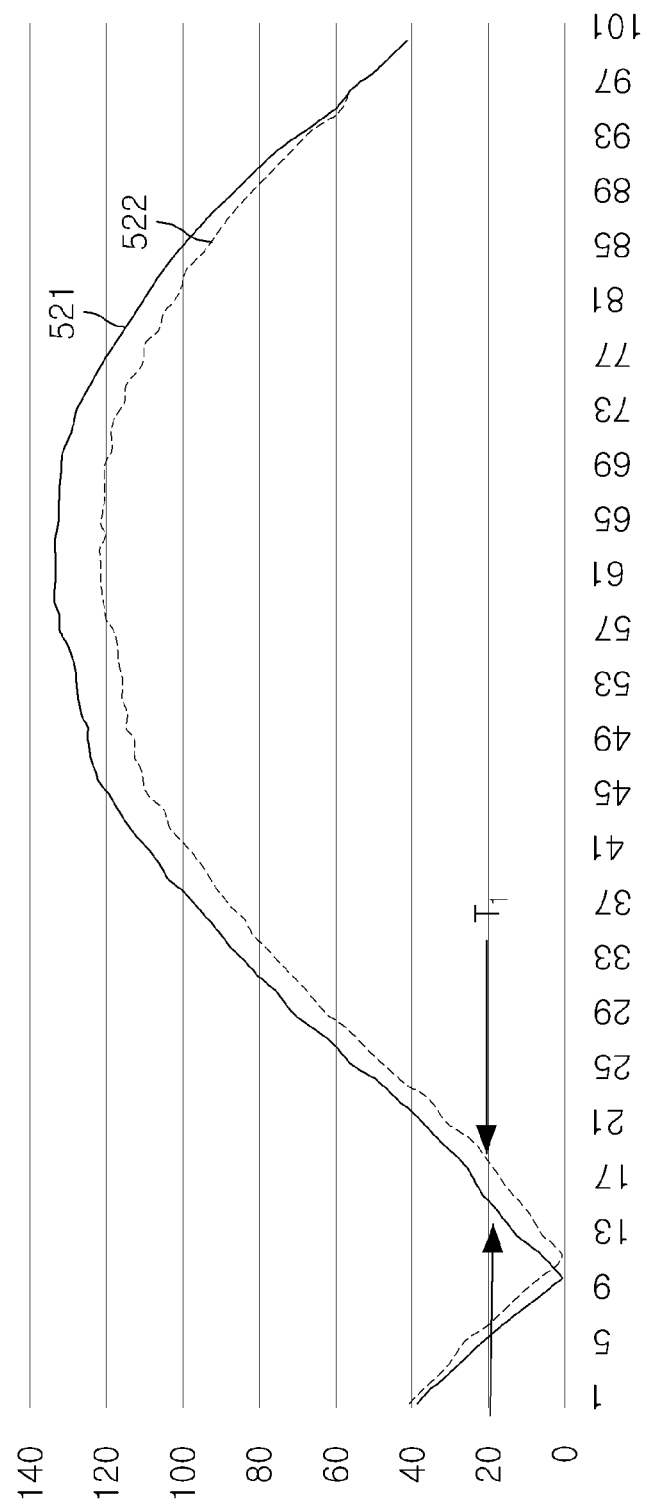
Figure 6A:
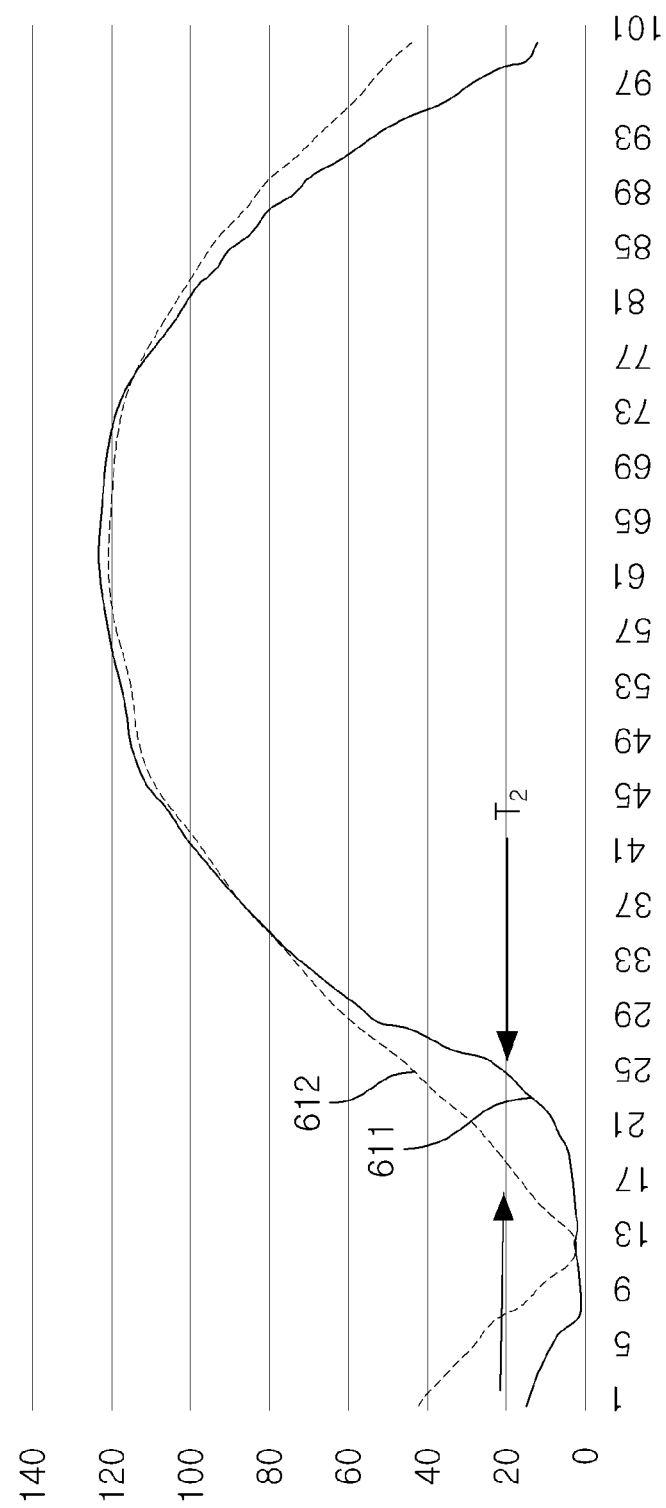

FIGS. 5A and 5B illustrate an example of a waveform diagram showing a phase difference of the target signal during two periods of a normal state. FIGS. 6A and 6B illustrate an example of a waveform diagram showing a phase difference of a target signal during two periods when arc is generated.

As illustrated in FIGS. 5A and 5B, in respect to the ADC value of the target signal, when the main control unit 110 calculates the ADC value of each of a first target signal 511/521 for the corresponding current and a second target signal 512/522 for the corresponding voltage in a first period (FIG. 5A) and a second period (FIG. 5B) which are continued in a normal state in which the arc, etc., is not generated for a sampling time 0, 1, 2, 3, . . . (e.g., an interval of 1/100 at a semi-period of 8.3 msec in power of 60 Hz), an interval (phase difference) T1 between time points when a predetermined signal magnitude level (e.g., ADC value of 20) is the same while the phase of the current is advanced is similarly maintained with a predetermined value.

As illustrated in FIGS. 6A and 6B, during the generation of the arc, when the main control unit 110 calculates the ADC value for each of a first target signal 611/621 for the corresponding current and a second target signal 612/622 for the corresponding voltage in a first period (FIG. 6A) and a second period (FIG. 6B) which are continued, an interval (phase difference) T2 between time points when a predetermined signal magnitude level (e.g., ADC value of 20) is the same while the phase of the voltage is advanced is shown as a value larger than that in the normal state and does not similarly have repeatability and has a value larger than that in the normal state in a predetermined fluctuation width.

Such a phase change characteristic may be more severe in low arc current than in instantaneous current or electric leakage or short-circuit and the arc may be detected by using the change of the phase in the arc current. Accordingly, through a comparison between the interval (phase difference) between the time points when the predetermined signal magnitude level (e.g., ADC value of 20) is the same and a predetermined threshold for the corresponding signals, when the corresponding interval is larger than the threshold, the corresponding current is recognized as overcurrent by the arc at the load side, thereby effectively interrupting the power supply to the load. In other words, when the target signal measured by using the current transformer 30/40, the voltage detector 50, etc., is input into the main control unit 110, whether to satisfy a threshold condition for the arc trip for a target signal during a digital analysis processing process is rapidly determined within the semi-period to effectively interrupt a power supply to the load for instantaneous overcurrent or overcurrent by electric leakage or short-circuit at the load side.

Most conventional commercialized arc fault circuit interrupters (AFCI) perform arc detection by a high-frequency detection scheme. In other words, the arc is detected by detecting characteristics of a high frequency generated by power loss when the arc is generated. In the case of the conventional arc detection scheme, a load by a discharge scheme such as a switched mode power supply (SMPS) or a mercury lamp and a high-frequency characteristic generated by rotation of a motor having a brush may cause a malfunction in detecting the arc. Further, the AFCI is vulnerable to a power noise characteristic by a poor environment of the existing wiring facilities. In particular, a range of the generated high frequency is variously generated from tens of KHz to hundreds of MHz. As a result, a frequency domain generated according to characteristics of a CT or OPAMP detecting the high frequency is differently determined and an instantaneous characteristic is shown even in the generation of the arc, and as a result, there is a limit in quantitative detection.

Therefore, the arc generation may require a significant technical know-how due to a non-repetitive characteristic and an instantaneous characteristic. Accordingly, in the conventional used arc detection scheme, a scheme of detecting the arc by checking whether the high frequency generated during a predetermined period is generated and the repeatability is introduced, but in the present invention, instead of the scheme of the high-frequency detection, a high-frequency noise component generated from the load is removed by using an LPF and characteristics of pure current/voltage and a distortion phenomenon thereof are detected to detect the arc.

Figure 7A:
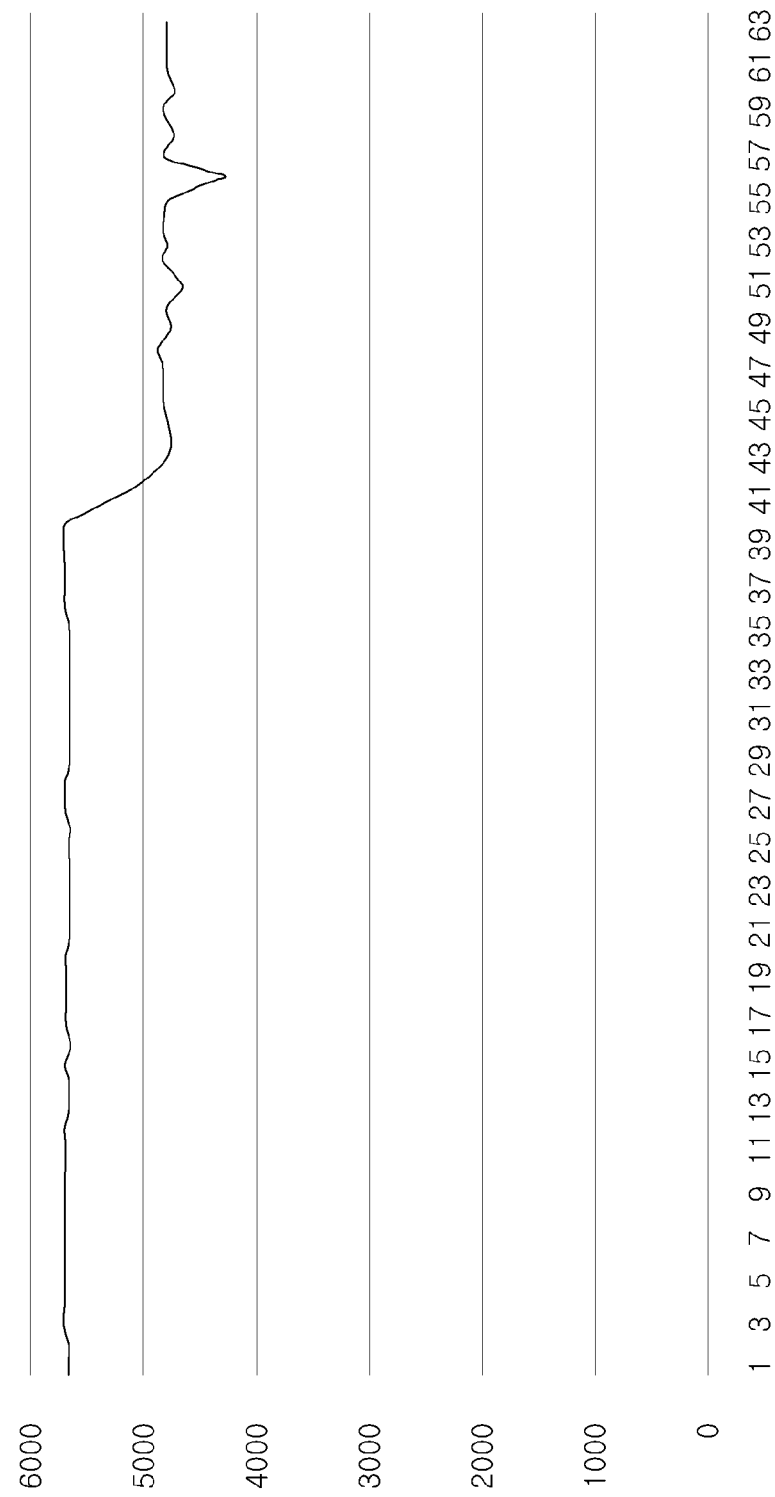
FIGS. 7A to 7C are diagrams for describing a determination for a change in phase difference of voltage and current at a predetermined signal magnitude level when an arc is generated in the present invention.
Figure 7B:
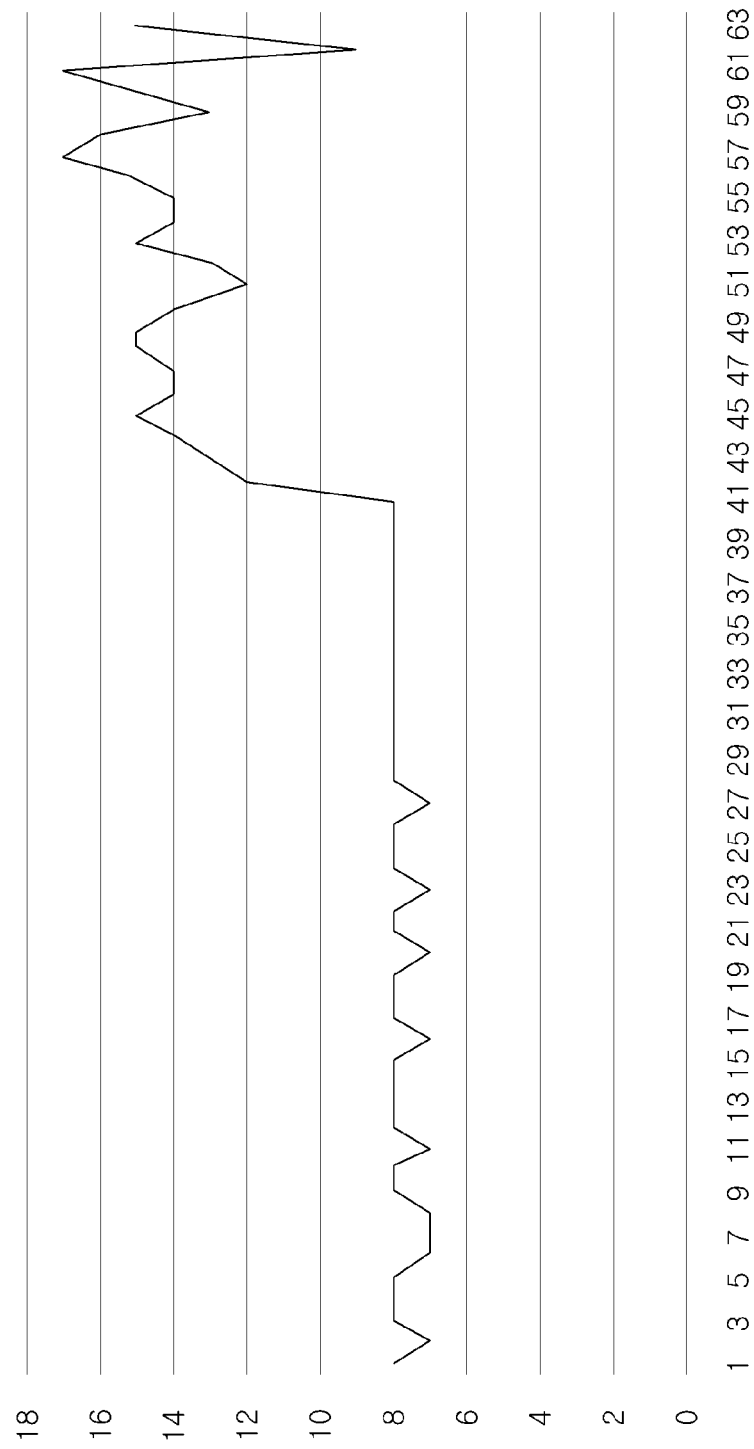
Figure 7C:
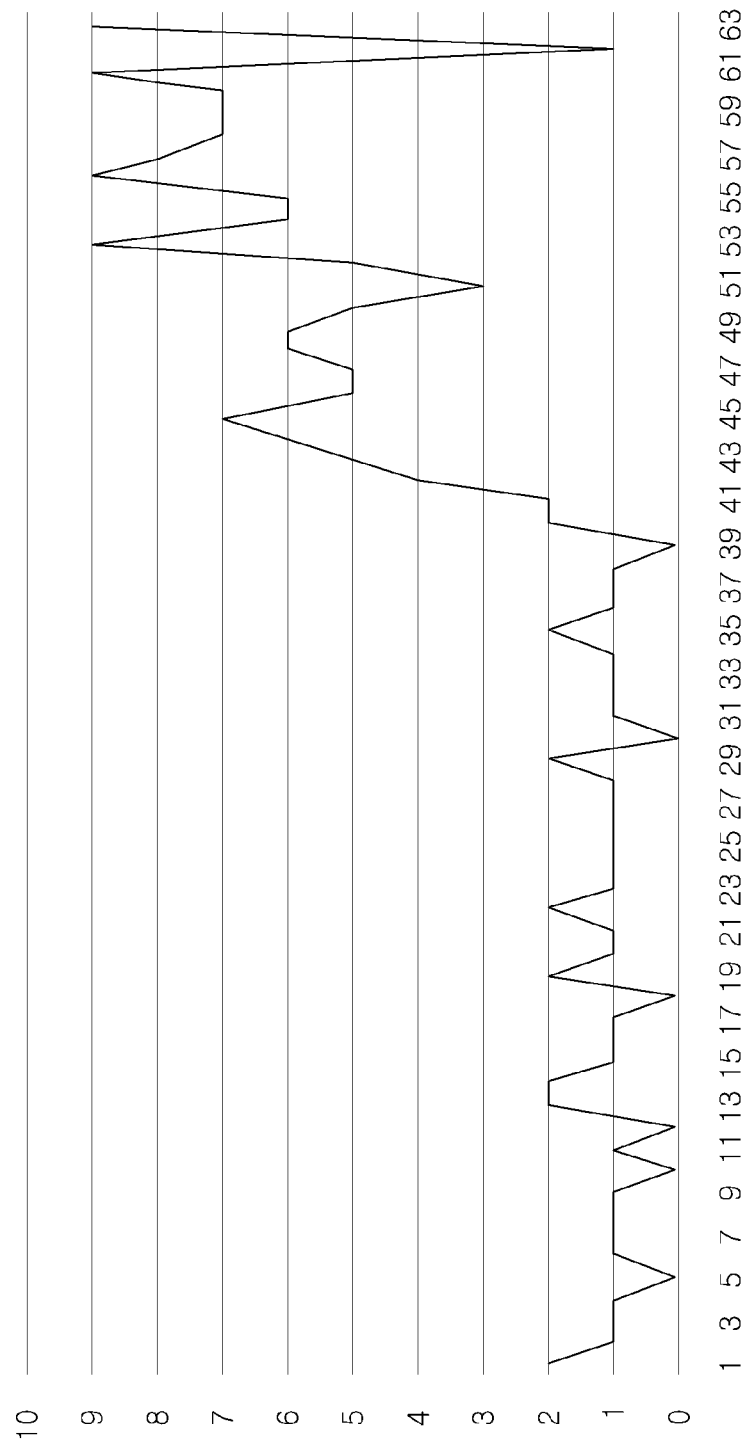

FIGS. 7A to 7C are diagrams for describing a determination for a change in phase difference of voltage and current at a predetermined signal magnitude level when arc is generated in the present invention.

FIG. 7A illustrates an example of a detection signal for system-wide summed current according to sampling periods 0, 1, 2, 3, . . . and a part where current decreases indicates that the arc is generated. In this case, FIG. 7A illustrates a form in which a location of the corresponding current phase in the predetermined signal magnitude level (e.g., 20) is oscillated while being pushed from approximately 8 (rad) portion to approximately 14 (rad) as illustrated in FIG. 7B. FIG. 7C illustrates a form in which the phase difference between the voltage and the current at the predetermined signal magnitude level (e.g., 20) is oscillated while being pushed from 2 (rad) or less to approximately 6 (rad). As such, it can be seen that when the arc is generated, a current phase value is pushed and energy is accumulated and lost as large as a pushed phase. It can be seen that the accumulated energy generates the arc and when the arc is generated, the phase change is changed. By detecting such a phenomenon, the arc generation may be detected. In other words, through a comparison between the interval (phase difference) between the time points when the predetermined signal magnitude level (e.g., ADC value of 20) is the same and a predetermined threshold (e.g., 6 rad, etc.) for the corresponding signals, when the corresponding interval is larger than the threshold, the corresponding current is recognized as overcurrent by the arc at the load side, thereby effectively interrupting the power supply to the load.

As such, in the present invention, for the arc detection, the phase difference between the voltage and the current is sensed by sampling the voltage and the current every semi-period of the AC power and the phase difference between the voltage and the current in a predetermined region is detected. In the characteristic of the normal load, the phase difference between the voltage and the current is constant and when the arc is generated, the phase difference between the voltage and the current irregularly fluctuates. By using such a characteristic, the arc may be detected. In a characteristic in which the arc is generated, energy should first be accumulated in order to generate the arc and a glow discharge phenomenon by energy accumulation occurs and the arc is then generated, but energy accumulation and explosion are repeated and the arc is generated. A phenomenon of the arc generation causes a difficulty in determining the arc. Therefore, in the standard, a determination time for arc interruption is set differently according to a capacity of the current and an arc interruption determination time by a specification of a "general condition for a KSC IEC 62606 accident arc detection device" is set to an interruption time within 1 second in 220 V 2.5 A and an interruption time of 0.12 seconds is set in a specification of 32 A.

FIGS. 8A to 8D are diagrams for describing a determination for a change in phase difference when arc is generated in a complex load of a resistor and a dimmer in the present invention.

For application to the complex load, the main control unit 110 may determine the predetermined signal magnitude level (e.g., ADC value of 20) to a plurality of levels corresponding to respective loads as described above and generate the control signal based on the phase difference at each level.

Figure 8A:
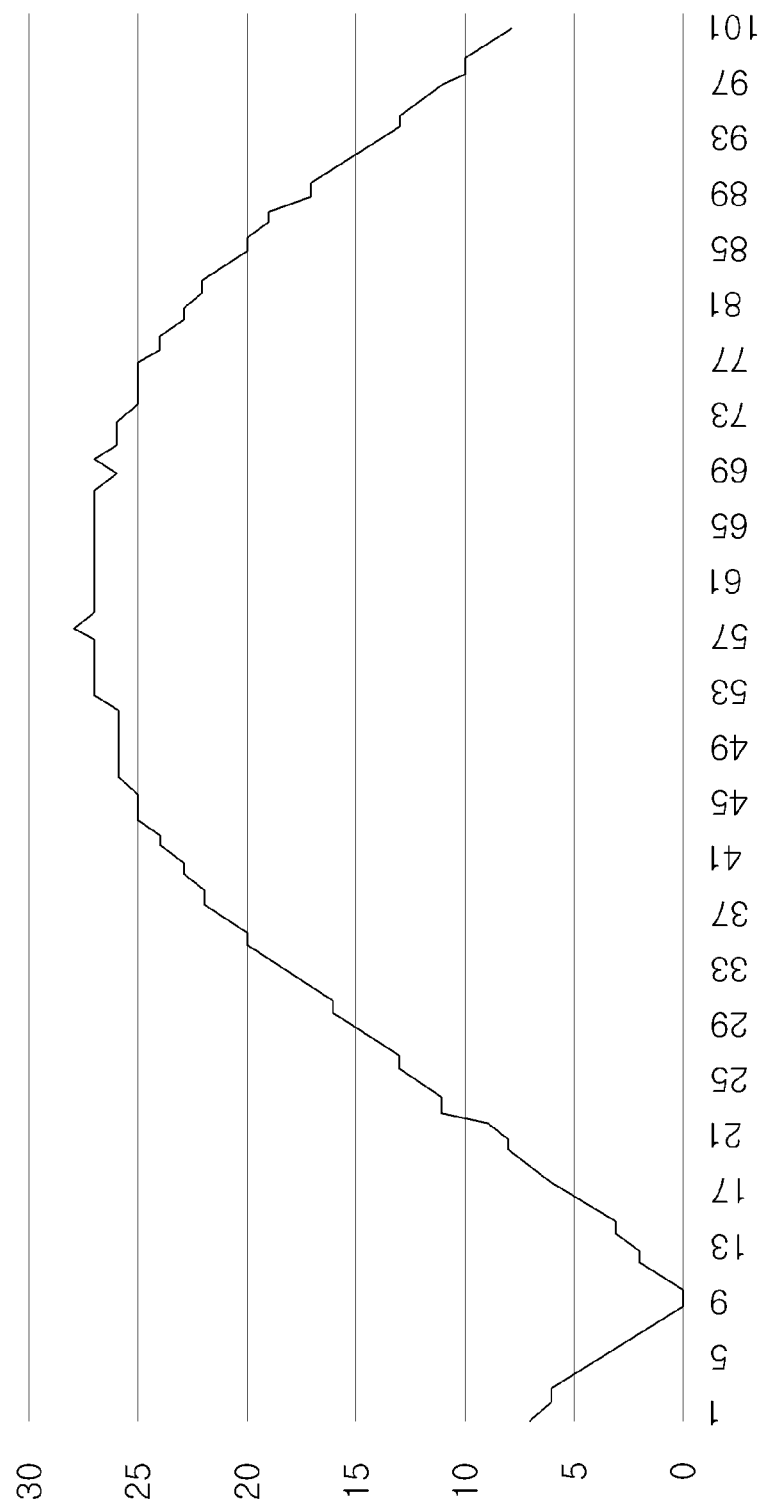
Figure 8C:
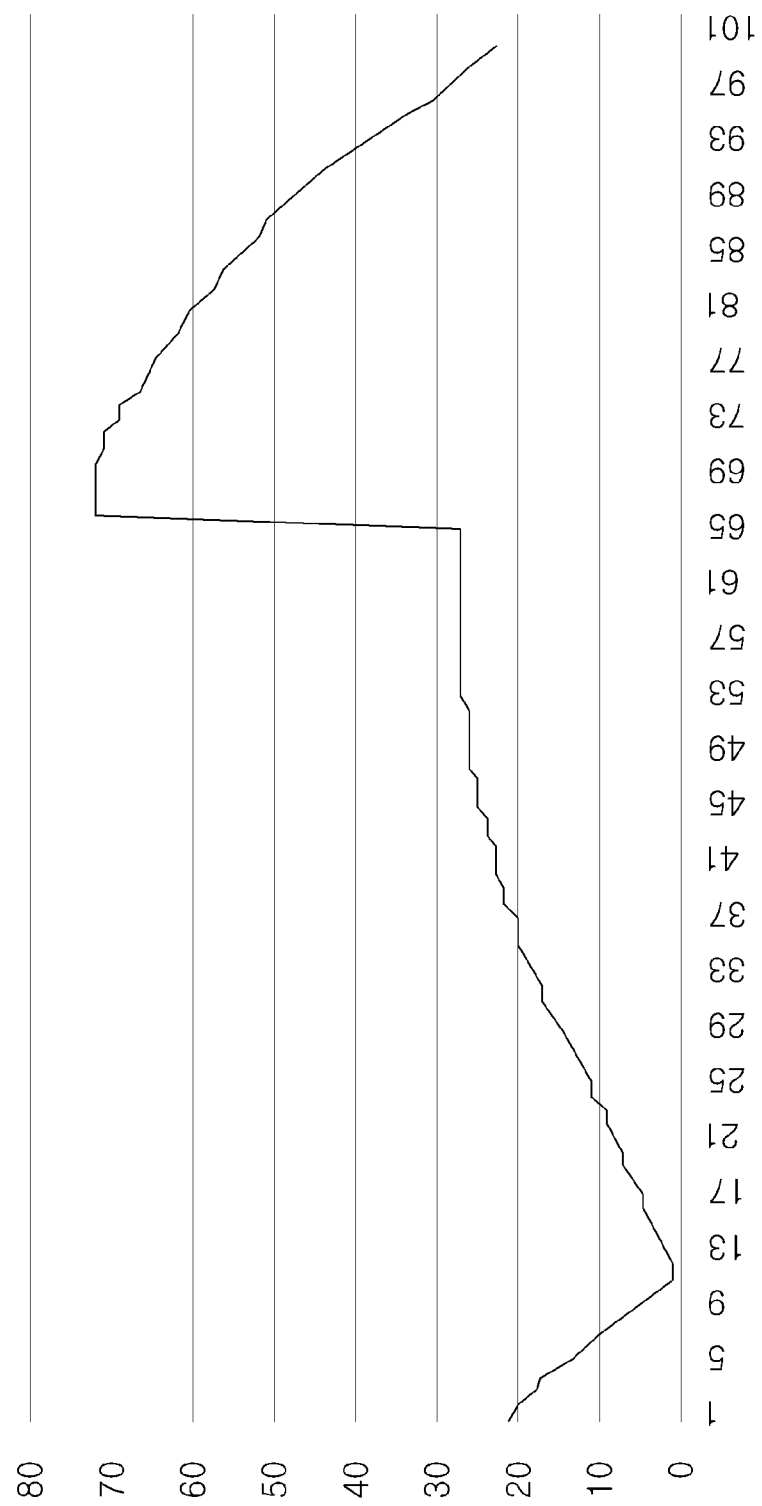
Figure 8D:
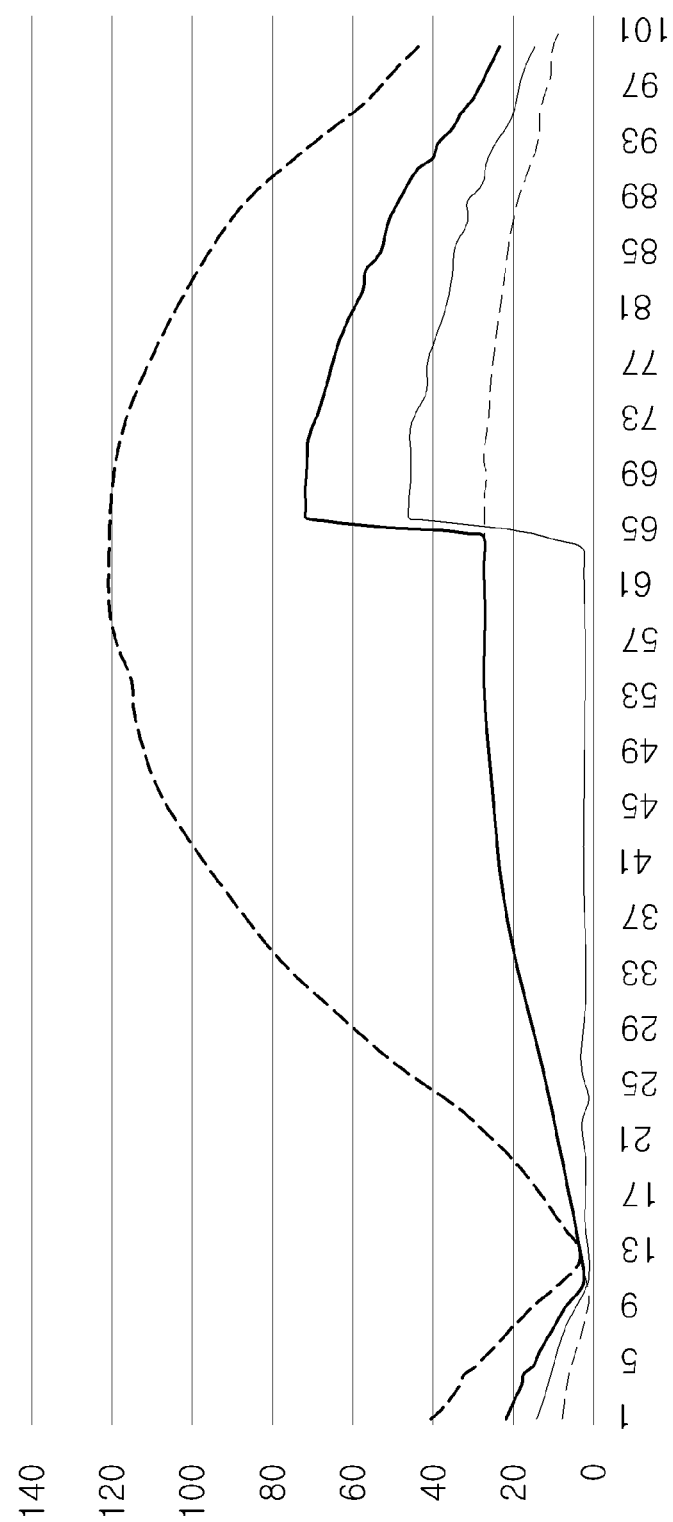

For example, the phases at two levels are detected and determined for arc detection in two complex loads including the resistor and the dimmer. FIG. 8A illustrates an example of a voltage characteristic depending on sampling time 0, 1, 2, 3, . . . for a resistive load alone, FIG. 8B illustrates an example of a voltage characteristic depending on sampling time 0, 1, 2, 3, . . . for a dimmer load alone, FIG. 8C illustrates an example of a voltage waveform when two loads are operated, and FIG. 8D is a waveform diagram when voltage of input AC power and respective waveforms of FIGS. 8A, 8B, and 8C are shown in one graph.

In the complex load, when the arc is generated only in the resistor load and when the arc is generated only in the dimmer load, the phase difference at different levels may be shown. In such a case, when the phase difference for two loads is detected based on one signal magnitude level, since it is detected that there is the phase difference only at the voltage level of the corresponding waveform, it is detected that there is no phase difference for arc generation for another load. Therefore, in order to detect the complex load, the arc generation is preferably determined for each of a level corresponding to the resistor load and a level corresponding to the dimmer load. For example, as illustrated in FIGS. 8A to 8D, in the detection of the phase, a location of a predetermined first level (e.g., ADC value of 10) corresponding to the resistor load and a location of a predetermined second level (e.g., ADC value of 40) corresponding to the dimmer load, and two levels are set to generate the control signal based on the phase difference at each level. In other words, a first interval (phase difference) at the first level (e.g., ADC value of 10) and a first threshold are compared to generate the control signal when a condition in which the first interval is larger than the first threshold is satisfied and a second interval (phase difference) at a second level (e.g., ADC value of 40) and a second threshold are compared to generate the control signal even when a condition in which the second interval is larger than the second threshold is satisfied. In this case, magnitudes of the first and second thresholds may be the same value, but may be set to different values.

As such, according to the overcurrent generated in the case of the arc, etc., the main control unit 110 generates a control signal and the circuit breaker 120 generates a drive signal for interrupting a power supply to the load according to the control signal (see S140 of FIG. 2), and the switch 10 accordingly drives a trip device (e.g., operating of a crossbar, a latch, etc.) to cut off a connection between an incoming terminal into which AC power comes and a load terminal connected to the load (turn off a contact between terminals to be separated), thereby interrupting the power supply to the load (see S150 of FIG. 2).

The main control unit 110 may store data of the ADC value of the target signal during a predetermined period (e.g., one hour, two hours, etc.) before the instantaneous strip, the electric leakage trip, or the arc trip in a memory. For example, the data of the ADC value of the target signal during a predetermined period is stored in a volatile memory connected to a USB port, and as a result, a cause analysis of the interruption occurrence and a follow-up measure may be applied to be rapidly taken. Furthermore, the main control unit 110 may output data for displaying the power interruption depending on occurrence of the instantaneous trip, the leakage trip, or the arc trip on a display device (e.g., LCD, LED, etc.) in real time in a text or graph form for the data of the ADC value of the corresponding target signal. According to the display, in order to determine the corresponding data when the power is interrupted, it may be easily verified whether the overcurrent is generated due to serial arc or parallel arc, or overload immediately through the display device (e.g., LCD, LED, etc.) even though an external interface is not connected.

As described above, according to the power interruption device 100 according to the present invention, when a value measured in a current transformer (CT), a voltage detector, etc., is input into the main control unit 110, it is accurately determined whether a target signal is a value equal to or more than a threshold by a scheme of measuring and comparing a difference in phase of voltage/current at a predetermined level for the target signals during a digital analysis processing process to effectively prepare for a disaster such as preventing fire or protecting a subsequent circuit by a rapid and accurate power interruption by arc at a load side.

As described above, the present invention has been described by specified matters such as detailed components, and the like and limited exemplary embodiments and drawings, but the description is just provided to assist more overall understanding of the present invention and the present invention is not limited to the exemplary embodiment and various modifications and changes can be made by those skilled in the art from a scope without departing from an essential characteristic of the present invention. Accordingly, the spirit of the present invention should not be defined only by the described embodiments, and it should be appreciated that claims to be described below and all technical spirit which is equivalent to the claims or equivalently modified are included in the claim of the present invention.

What is claimed is:

1. A power interruption method by a power interruption device, comprising:
   receiving a first detection signal and a second detection signal detected by using a current transformer and a voltage detector coupled to a power supply line supplying power to a load, respectively;
   generating a control signal by sensing generation of arc in the load for a first target signal and a second target signal input based on the first detection signal and the second detection signal, respectively; and
   interrupting the power supply line to the load according to the control signal,
   wherein in the generating of the control signal, an analog to digital converter (ADC) values of the first and second target signals, respectively are generated to generate the control signal based on a phase difference of each of the first and second target signals at a predetermined signal magnitude level, and
   wherein the predetermined signal magnitude level includes each level corresponding to the respective load of complex and the control signal is generate based on the phase difference at each level.

2. The power interruption method of claim 1, further comprising:
   wherein the power is AC power,
   generating the first and second target signals by rectifying the first detection signal and the second detection signal, respectively before the generating of the control signal.

3. The power interruption method of claim 2, wherein the phase difference is determined within a semi-period of the AC power.

4. The power interruption method of claim 2, wherein the first and second target signals are signals which are subjected to low pass filtering and predetermined signal adjustment for removing high-frequency noise after the respective target signals are rectified.

5. The power interruption method of claim 1, wherein in the generating of the control signal, the power supply line to the load is effectively interrupted for the arc generation at the load side by comparing the phase difference and a threshold for interrupting the power supply line to the load by an arc trip.

6. The power interruption method of wherein for each level, respective thresholds for interrupting the power supply line to the load by arc trip are set to the same value.

7. The power interruption method of wherein for each level, respective thresholds for interrupting the power supply line to the load by the arc trip are set to different values.

8. The power interruption method of claim 1, further comprising:
   storing, in a memory, data of the analogy to digital converter (ADC) value of each of the first and second target signals during a predetermined period before the arc is generated.

9. The power interruption method of claim 1, further comprising:
   displaying a text or graph for the data of the analog to digital converter (ADC) value of each of the first and second target signals on a display device in real time.

10. A power interrutpion device comprising:
    a current transformer and a voltage detector coupled to a power supply line supplying power to a load;
    a main control unit generating a control signal by sensing generation of arc in the load for a first target signal and a second target signal input based on a first detection signal and a second detection signal detected by using the current transformer and the voltage detector, respectively; and
    a circuit breaker interrupting the power supply line to the load according to the control signal,
    wherein the main control unit generates an analog to digital converter (ADC) values of the first and second target signals, respectively, to generate the control signal based on a phase difference of each of the first and second target signals at a predetermined signal magnitude level, and
    wherein the predetermined signal magnitude level includes each level corresponding to the respective loads of a complex load and the control signal is generated based on the phase difference at each level.

* * * * *